(12) United States Patent
Becker

(10) Patent No.: US 10,903,543 B2
(45) Date of Patent: Jan. 26, 2021

(54) PCB TRANSMISSION LINES HAVING REDUCED LOSS

(71) Applicant: Cray Inc., Seattle, WA (US)

(72) Inventor: Andy Becker, Eau Claire, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/370,498

(22) Filed: Dec. 6, 2016

(65) Prior Publication Data

US 2018/0160526 A1    Jun. 7, 2018

(51) Int. Cl.
| | |
|---|---|
| *H01P 3/08* | (2006.01) |
| *H01P 3/02* | (2006.01) |
| *H05K 1/02* | (2006.01) |
| *H01P 11/00* | (2006.01) |

(52) U.S. Cl.
CPC ............... *H01P 3/026* (2013.01); *H01P 3/08* (2013.01); *H05K 1/025* (2013.01); *H05K 1/0219* (2013.01); *H05K 1/0237* (2013.01); *H01P 11/003* (2013.01); *H05K 2203/0307* (2013.01)

(58) Field of Classification Search
CPC .......................................................... H01P 3/08
USPC ..................................... 333/238, 246, 1, 4, 5
See application file for complete search history.

(56) References Cited

U.S. PATENT DOCUMENTS

| | | | |
|---|---|---|---|
| 5,922,650 A | 7/1999 | Ye | |
| 6,828,514 B2 | 12/2004 | Chan et al. | |
| 6,888,218 B2 | 5/2005 | Kling et al. | |
| 6,964,884 B1 | 11/2005 | Chan et al. | |
| 7,151,420 B2 | 12/2006 | Brunker et al. | |
| 7,193,324 B2 | 3/2007 | Hsu | |
| 7,298,234 B2 | 11/2007 | Dutta | |
| 7,383,629 B2 | 6/2008 | Lauffer et al. | |
| 7,489,004 B2 | 2/2009 | Combi et al. | |
| 7,609,500 B2 | 10/2009 | Anthony et al. | |
| 7,674,988 B2 | 3/2010 | Joodaki | |
| 7,755,445 B2 | 7/2010 | Dutta et al. | |
| 8,071,891 B2 | 12/2011 | Chang et al. | |
| 8,502,082 B2 | 8/2013 | Chan et al. | |
| 8,569,873 B2 | 10/2013 | Mutnury et al. | |
| 2004/0229024 A1* | 11/2004 | Harada | H05K 1/0242 428/209 |
| 2005/0083147 A1* | 4/2005 | Barr | H01P 3/088 333/33 |
| 2009/0184778 A1 | 7/2009 | Park et al. | |

(Continued)

OTHER PUBLICATIONS

European Examination Report, EP Application No. 17205368.8, dated Jul. 2, 2019, 5 pages.

*Primary Examiner* — Stephen E. Jones
(74) *Attorney, Agent, or Firm* — Park, Vaughan, Fleming & Dowler LLP

(57) ABSTRACT

Signal transmission structures within a printed circuit are formed to have reduced loss by making specific accommodations to reduce the surface roughness of an adjacent power plane, and thereby reducing the effects of magnetically induced currents. The power plane structure will retain sufficient surface roughness to accommodate manufacturing operations, while also contributing to reduced signal transmission losses in the adjacent signal transmission structure. The transmission structures thereby being capable of more efficiently transmitting high speed signals without undesired attenuation and loss.

9 Claims, 7 Drawing Sheets

(56) References Cited

U.S. PATENT DOCUMENTS

2011/0226516 A1 9/2011 Takeda
2013/0285769 A1 10/2013 Gerlach et al.

* cited by examiner

PCB TRANSMISSION LINES HAVING REDUCED LOSS

BACKGROUND

Printed circuit boards (PCBs) are specifically designed to support electronic components, and to facilitate the communication of electrical signals. As PCBs have evolved, the complexity of the electronic components, and the complexity of the signal transmission structures on the PCB have evolved considerably. Modern day circuit boards are typically multi-layer structures, with communication paths extending between hundreds of different components. As such, the board layout and interaction of all structures can potentially effect overall operation and efficiency.

In current PCB design, there is an increased demand for high-speed communication capabilities. This typically involves the ability to provide a high-speed or high-frequency connection between two or more mounted components, with signals being carried by various communication paths extending through the circuit board structure. Further, these communication paths may extend for relatively short distances or may extend longer distances, depending upon the nature of the circuit board and the environment within which the board is used. In some cases, communication paths may simply be a few centimeters in length, while other cases require these paths to be one to two meters. Realistically, circuit board structures typically do not exceed this size, thus one to two meters is a practical upper limit. That said, future designs and applications may demand that this distance be increased.

As mentioned above, high-speed signal transmission is also commonly demanded, typically involving signals with a frequency range of 3 to 56 gigabits per second (Gbps), or even higher. Operating at this speed often creates several complications, and creates a need to closely examine signal losses throughout the PCB.

Printed circuit boards are beneficial in many applications since they provide an inexpensive and ubiquitous way to transmit high-speed data between various electrical components in many different systems, including datacom systems. That said, circuit board structures typically display a relatively high level of electrical loss as high-speed data signals traverse the PCB. Typically, these signals are communicated through a confining transmission line structure which propagates the signal's electromagnetic energy. Transmission lines in general must confine this signal energy and allow it to propagate relatively unimpeded, without incurring too much electrical loss, either in the form of skin-effect metal resistive loss or as dielectric loss in the surrounding material.

In many situations, a stripline structure is utilized to carry high-speed signals within a PCB. Generally speaking, the stripline transmission structure involves two parallel tracks or traces within a PCB extending over a predetermined distance and embedded at a predetermined location. Alternatively the tracks (or signal traces) could be on an upper surface of the PCB. Due to the performance required, the stripline structures themselves are often isolated from other signal traces in some manner. Further, by utilizing a parallel pair of tracks, a differential signal transmission technique can be utilized. As is well recognized, this differential technique is more reliable, and less susceptible to transmission errors.

As suggested above, high-speed connections (i.e. high speed communication paths) are subject to multiple detrimental effects, such as signal loss (also referred to as signal attenuation), signal deterioration and unwanted reflections, all caused by the inherent characteristics of known substrate structures. In the particular case of signal attenuation, this effect is typically expressed in terms of either the "rise time" or the "fall time" of the signal's response to a step change at the input.

One known factor which can contribute to signal attenuation is surface roughness of the conductive layer through which the signals pass. Conversely, PCB manufacturers who laminate several dielectric and conductive layers to form the final board structure seek to attain some level of roughness, which will promote adhesion between the various materials. Unfortunately, such roughness may also adversely affect signal passage. Thus, it is desirable to balance these concerns, and provide a PCB which has the signal carrying structures of conductive layers with optimal roughness (for sound adhesion to corresponding dielectric layers) but also having structures which are smooth enough so that the surface irregularities of such layers do not significantly impede signal passage.

SUMMARY

While much attention has been paid to reducing resistive and dielectric losses in the signal carrying structures of the PCBs (i.e. the transmission lines), very little attention has been given to the effects of the structures adjacent to and cooperating with the these transmission lines. Particularly, the effects of the ground and power planes have not been considered in any detail. One particular characteristic to be considered is the very high level of roughness seen in typical power plane structures on today's PCBs. When considered, it has been discovered that modifying or smoothing the metal roughness of the adjacent power plane structure and ground plane structure, will result in a significantly lower loss PCB transmission line.

In order to further reduce transmission losses, and provide more efficiency to the circuit board construction, the surface structure of the power plane is modified and/or smoothed to achieve optimum operation. By making these changes, the transmission losses are reduced, thus providing the ability for signals to be communicated more efficiently and robustly. More specifically, the circuit board is modified such that power planes, which are located predetermined distances from the stripline communication structures, are modified to reduce surface roughness and eliminate undesired stray currents. In this process, a desired surface roughness for the power plane is then incorporated into the design, thus improving the efficiency of the stripline communication structure, and further reducing losses. Consequently, signals are more reliably transmitted between components and errors avoided.

In the fabrication of PCBs, there are several related processes needed to create the desired structures. Those skilled in the art will recognized that these steps typically involve the related steps of coating, depositing materials, etching and polishing of certain structures. The metal roughness of the power planes can be reduced either through oxide chemical foil attach processes, or other techniques, thus significantly reducing the losses seen in these transmission lines, without incurring a major cost penalty. Again, although it is commonly known that metal roughness effects in the transmission line structures themselves create additional insertion loss, little attention has been paid in reducing metal losses in these adjacent power planes. When the magnetically induced currents created in the adjacent power planes are considered and minimized, the overall data signal insertion loss is reduced. Thus, by having a PCB with smoothed surface roughness on the power plans, overall efficiency is greatly improved.

BRIEF DESCRIPTION OF THE DRAWINGS

Further advantages and benefits of the preferred embodiments are discussed and described below, in conjunction with the drawings in which.

DESCRIPTION OF THE PREFERRED EMBODIMENTS

As suggested above, transmission line losses in printed circuit boards (PCBs) can be significant factors affecting efficiency and performance. This is especially true when high-frequency signals are being transmitted from component to component. As can be appreciated, even though high speed signals are transmitted relatively short distances, the cumulative losses and attenuation can create significant problems.

Figure 1:
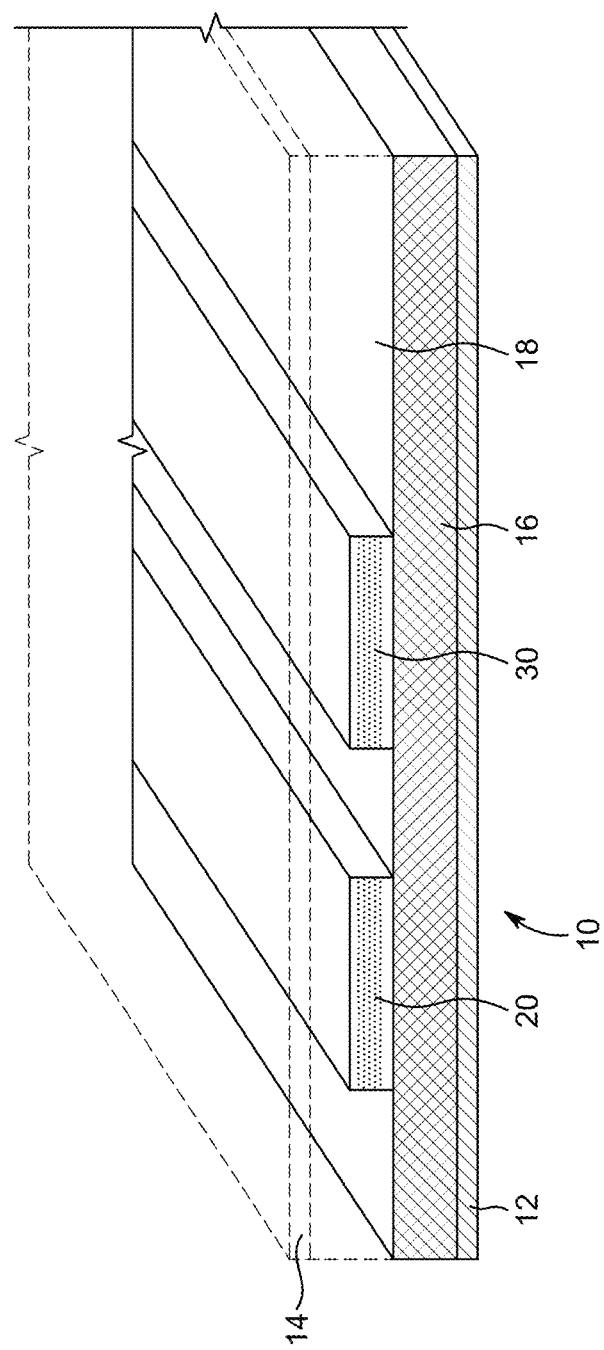
FIG. 1 is a schematic drawing illustrating a basic PCB stripline communication structure.

The use of a stripline transmission structure within PCBs is a generally well understood technique for communicating high-speed signals. Referring to FIG. 1, a basic schematic illustration of a typical stripline structure 10 is presented. It will be appreciated by those skilled in the art that this structure would be only a portion of the PCB and will typically be buried within several other layers making up the circuit board itself. Similarly, these structures may exist anywhere within the PCB, and the positioning will be largely dependent on board layout, component placement, component density, and many other PCB design considerations.

Figure 2:
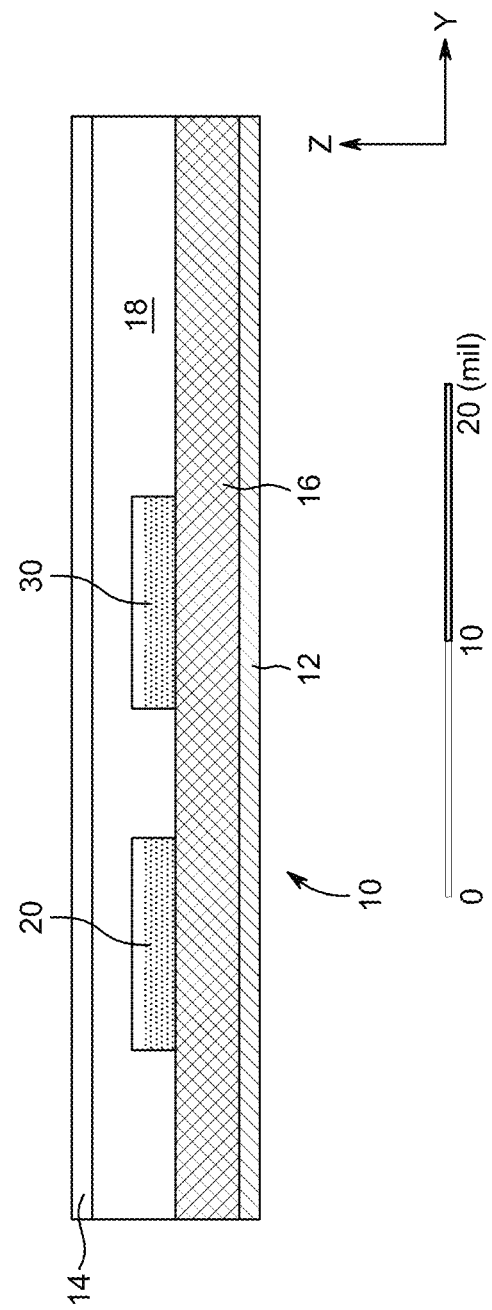
FIG. 2 is a cross-section illustrating the example stripline communication structure.

Referring again to FIG. 1, one embodiment of a PCB structure 10 includes a first stripline structure 20 and a second stripline structure 30. In this illustration, these stripline structures are shown as rectangular tracks or bars positioned on a layer and extending some distance within PCB 10. First stripline structure 20 and second stripline structure 30 are positioned or placed upon a core 16 which is typically made up of a dielectric material. On an opposite side of core 16 is a ground plane 12. As will be well recognized, ground plane 12 is typically a metalized planar surface, which is electrically coupled to a ground or reference signal. On an upper side, positioned above and surrounding the typical first stripline 20 and second stripline 30 is a further dielectric layer 18, which often will include an epoxy and/or prepreg reinforcing fiber. As shown in FIG. 2, this portion is generally illustrated in dashed-lines to allow the viewing of various components. Many variations could be utilized for this dielectric layer 18, depending upon the desired design characteristics. Positioned above the second dielectric layer, or prepreg 18 is a power plane 14. Similar to ground plane 12, power plane 14 is generally a metalized planar surface which is connected to a power source of some type. In many PCBs, this is a five or twelve volt power source, however it could be operated at virtually any level depending upon the particular circuit involved.

FIG. 2 shows a cross-sectional view of the same structure illustrated in FIG. 1. Again upper dielectric layer 18 and power plane 14 were illustrated in dashed line format in FIG. 1 for ease of viewing and understanding. Those skilled in the art will recognize that this is a solid structure as shown in FIG. 2, with both first stripline 20 and second stripline 30 being embedded within this particular portion of the PCB 10.

Figure 3:
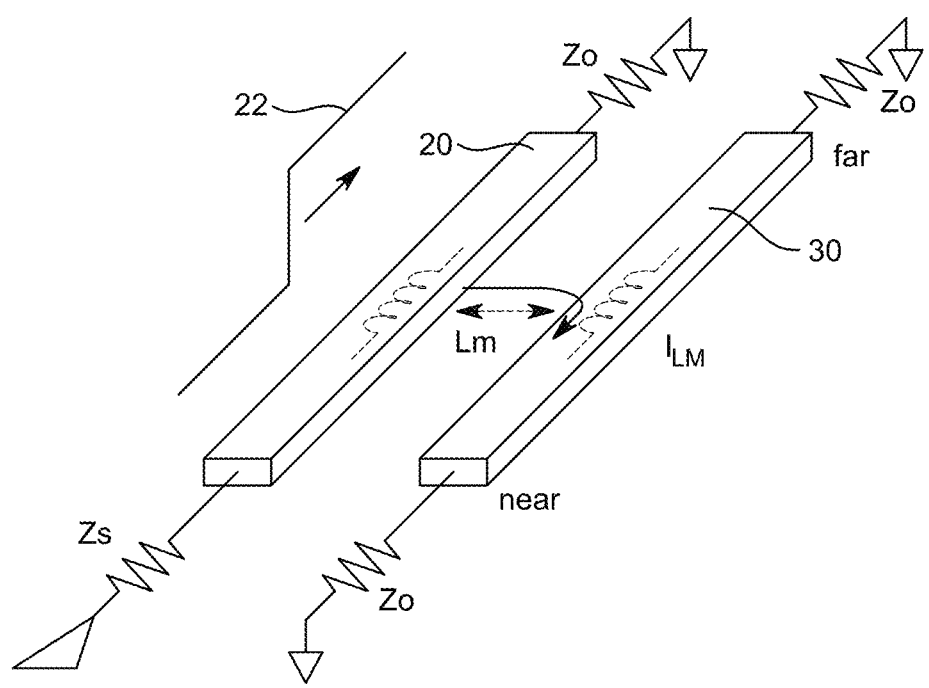
FIG. 3 is a block diagram illustrating mutual inductance created by the stripline structure.

As mentioned above, the use of parallel stripline structures accommodates the transmission of differential signals, thus helping to minimize or eliminate data loss during the transmission process. The transmission of opposing signals, inherent in this differential transmission technique, does have various complications. More specifically, a mutual inductance in each stripline structure will induce current on the opposite stripline structure, in a direction opposite to the driving current. This is generally illustrated in FIG. 3, which provides a very general electrical schematic related to first stripline 20 and second stripline 30.

In this example, a signal 22 is transmitted in first stripline 20. Due to the proximity of second stripline 30, and the mutual inductance (Lm) therebetween, a current will be induced in second stripline 30, in a direction opposite signal 22. Although those skilled in the art will generally consider these inductive currents in relation to the design of the stripline structures themselves, it has been discovered that a similar consideration of inductive currents on both power and ground planes shows that undesired induced current can be created on those surfaces as well.

Figure 4:
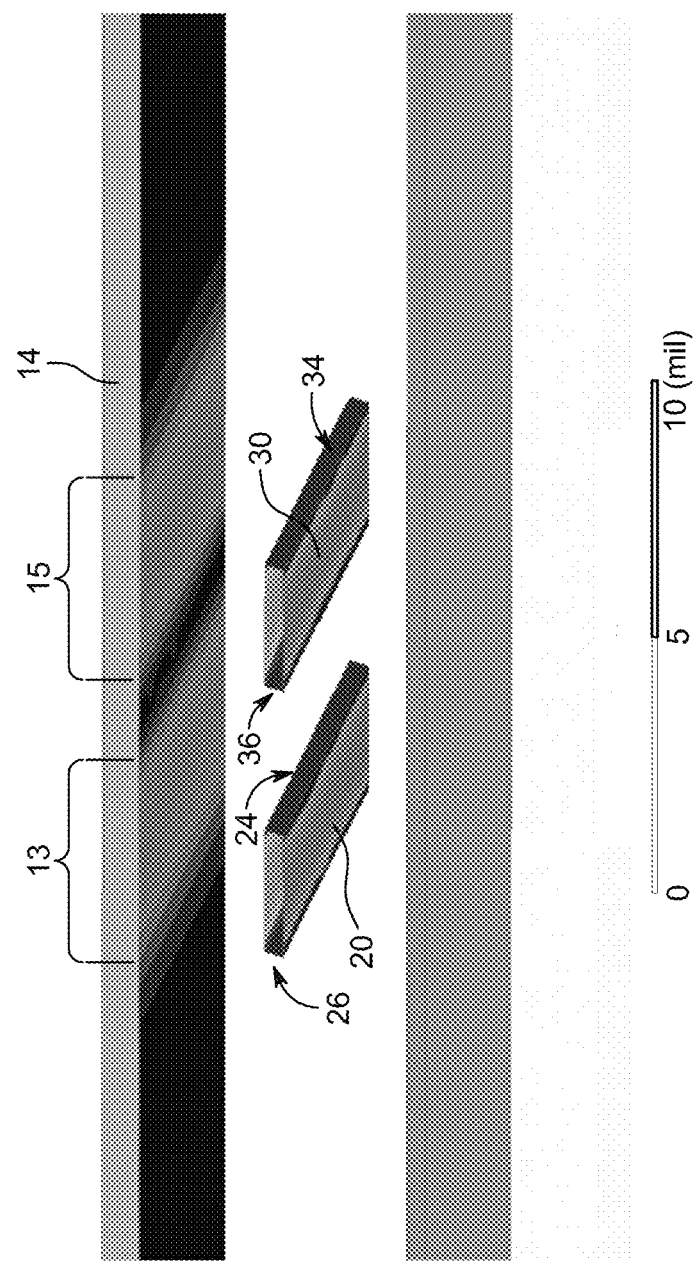
FIG. 4 is an additional schematic illustration showing current density created in the stripline structure.

As best illustrated in FIG. 4, when signals are transmitted, a current density on various surfaces of first stripline 20 and second stripline 30 is typically created. As will be appreciated, these current densities are the highest on the sides or edges 24, 26 of first stripline 20 and sides or edges 34, 36 of second stripline 30. Significantly, however, a noticeable surface current is developed on power plane 14 at a location directly above first stripline 20 and second stripline 30. Specifically, portion 13 of power plane 14 located above first stripline 20, and portion 15 above second stripline 30 will both have an induced current density.

Again, in order to further reduce transmission line losses, it has been discovered that the effects of power plane 14 can adversely affect signal transmission efficiency. More significantly, when the existence of the above mentioned current densities, and the surface condition of the power plane is considered, it has been found that significant reductions in transmission line losses can be achieved by appropriately tailoring these surface structures. Generally speaking, by having a rough, lossy power plane surface, the effects of inductive current are significant, thus resulting in similar reductions in transmission line efficiency.

Figure 5:
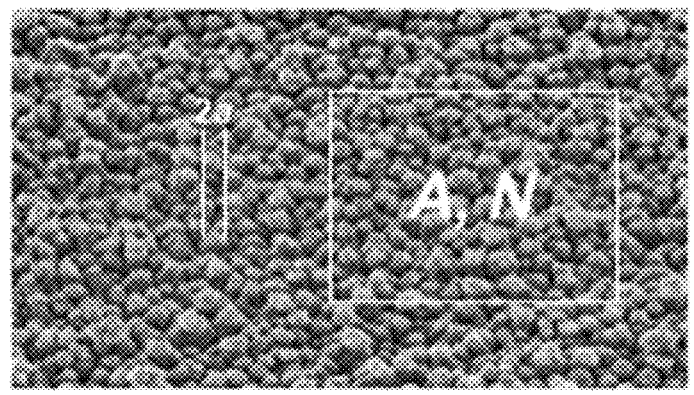
FIG. 5 is an highly magnified view of the contemplated power plane structure of the preferred embodiments.

FIG. 5 generally illustrates a highly magnified surface area of an embodiment of the power plane 14. In this embodiment, the particular surface area includes a number of nodules. To provide a usable model of a particular surface area, each nodule is assumed to be spherical, having a radius "a". Further, the density of the nodules is modeled so that N nodules exist within an area "A". Utilizing known concepts of a finite conductivity boundary, one embodiment the surface is modeled as a copper plane having conductivity of 3E7 S/m. In this embodiment, the surface ratio (Sr) is determined as follows:

$$Sr = 4*Pi*a^2*N/A.$$

To model a lossy and rough power plane, the nodule radius is assumed to be 2 μm, and thus the Sr=2.9. This provides a usable model for a rough and lossy power plane, and thus allows for further consideration of the effects of this surface.

As is well understood by those skilled in the art, the spacing between the stripline structures 20, 30, the ground plane 12, and the power plane 14 can affect the various operating parameters of the PCB. That said, PCB manufacturers also recognize that changes in separation also require that the thickness of various dielectric materials be increased in order to achieve these desired distances. Naturally, additional thickness requires additional raw materials, and can also affect the overall board structure. This is especially true when the PCB includes many layers.

Figure 6:
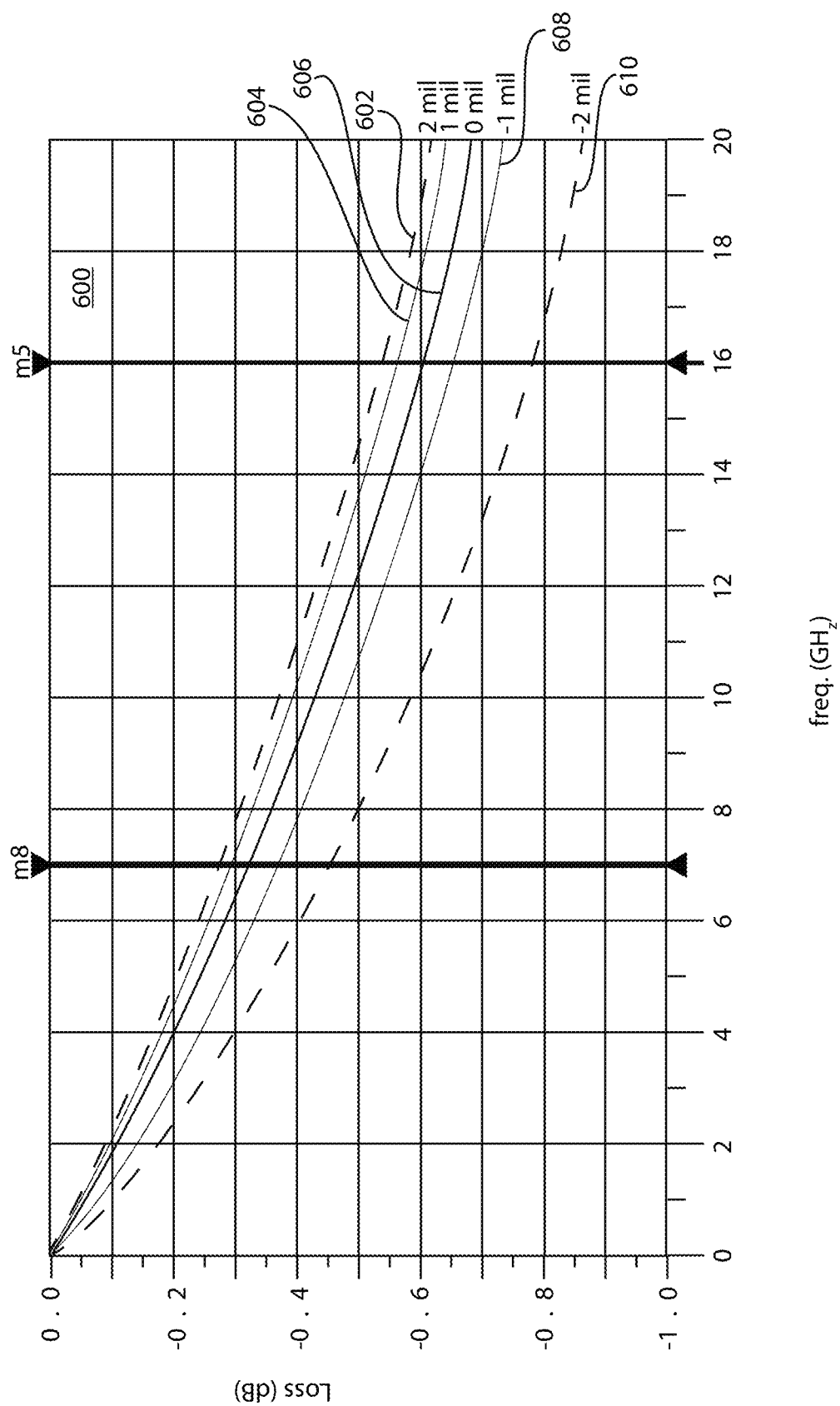
FIGS. 6 and 7 show various loss characteristic charts, while also illustrating the loss characteristics for stripline communication structures when various characteristics are changed.

Referring to FIG. 6, the impact of varying dielectric thicknesses on stripline losses is generally illustrated. More specifically, a graph 600 is provided which illustrates the stripline transmission losses, as the thickness of the core 16 and dielectric layer 18 is varied. Here, a baseline loss determination is made using a standard spacing and graph line 606 illustrates losses across a frequency range. Next similar loss determinations are made when the thickness of the base 16 and dielectric material 18 is changed, where:

graph line 602 illustrates stripline loss, when the thicknesses are increased 2 mils;

graph line 604 illustrates stripline loss when the thicknesses are increased 1 mil;

graph line 608 illustrates stripline loss when the thicknesses are decreased 1 mil; and graph line 610 illustrates stripline loss when the thicknesses are decreased 2 mils.

As will be appreciated, the transmission losses in stripline structures change considerably when the thickness of core 16 and dielectric layer 18 is changed, with losses generally increasing as the core 16 and dielectric layers get thinner.

Figure 7:
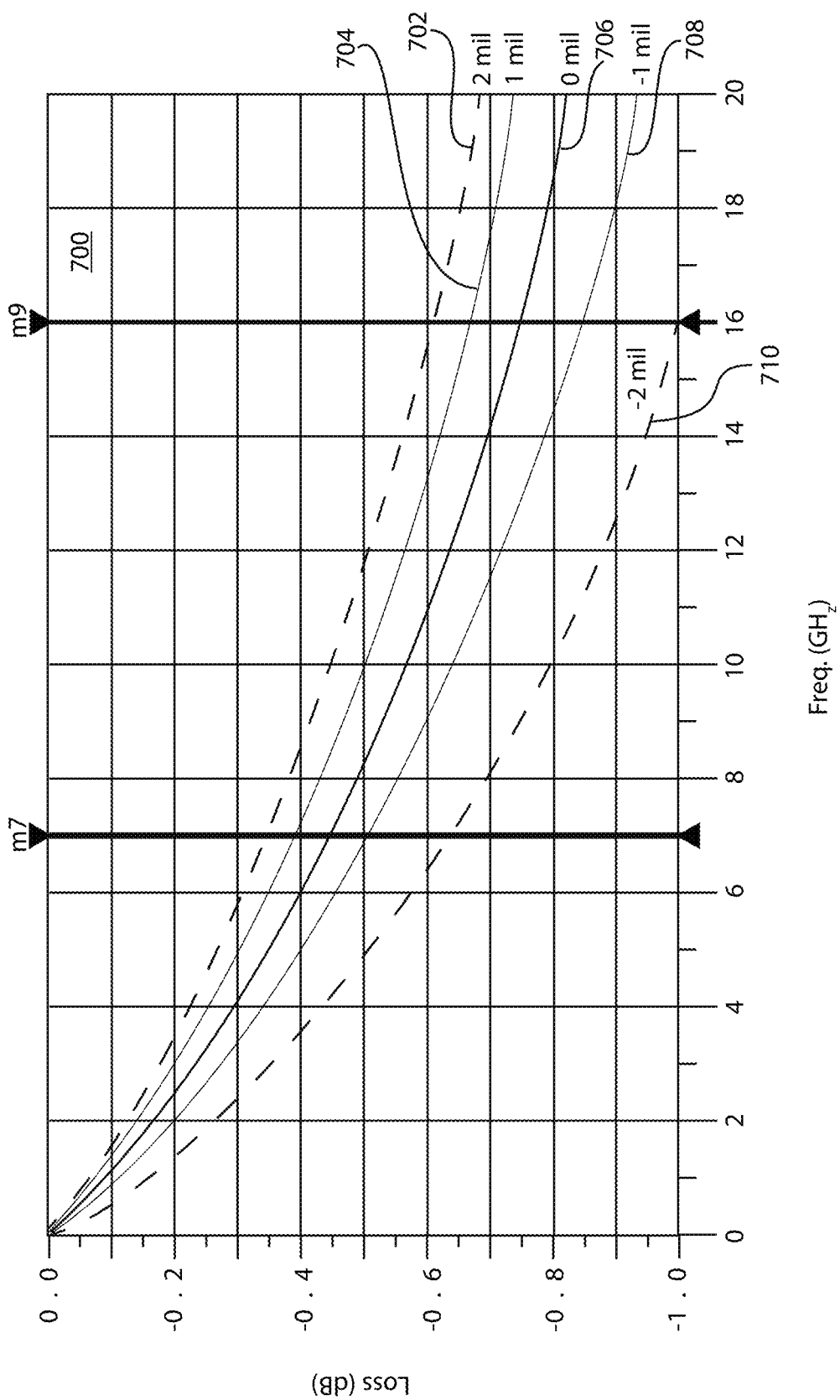

Referring now to FIG. 7, a similar graph 700 is shown, however, the particular transmission system has included the above-discussed power plane roughness considerations. More specifically, the structure is assumed to have the above mentioned rough and lossy power plane structure. In this figure, the transmission losses are then determined for this type of structure. Again, a baseline loss determination is made using a standard spacing for base 16 and dielectric layers 18. Graph line 706 illustrates losses across a frequency range using the above mentioned standard spacing. Next similar loss determinations are made when the thickness of base 16 and dielectric layer 18 is changed, with:

graph line 702 illustrating stripline loss, when the thicknesses are increased 2 mils;

graph line 704 illustrating stripline loss when the thicknesses are increased 1 mil;

graph line 708 illustrating stripline loss when the thicknesses are decreased 1 mil; and graph line 710 illustrating stripline loss when the thicknesses are decreased 2 mils.

Again, the same type of changes are seen, with the losses increasing as the base 16 and dielectric layers 18 get thinner. As generally suggested above, however, there is a tradeoff with the layer thickness however, since a thinner board using less material is generally preferred.

More significantly however, when FIGS. 6 and 7 are compared, it is clear that the stripline losses are greatly changed when the roughness considerations are not present. Stated differently, the consideration of the rough and lossy power plane clearly causes a uniform increase in stripline losses. For comparison purposes various loss measurements have been obtained at 7 gigahertz and 16 gigahertz, for each transmission line structure. When calculated, these numbers are as follows:

| Frequency/Condition | Changes in Base/Dielectric Thickness | | | | |
|---|---|---|---|---|---|
| | −2 mil | −1 mil | 0 | +1 mil | +2 mil |
| 7.0 GHz without roughness considerations | −0.446 | −0.384 | −0.345 | −0.324 | −0.309 |
| 16.0 GHz without roughness considerations | −0.738 | −0.643 | −0.583 | −0.552 | −0.529 |
| 7.0 GHz with roughness considerations | −0.593 | −0.481 | −0.413 | −0.370 | −0.344 |
| 16.0 GHz with roughness considerations | −1.0 | −0.815 | −0.704 | −0.633 | −0.591 |

As generally outlined above, the reduction of power plane surface roughness can have an unexpected positive impact on stripline transmission losses. As such, it is desirable to reduce roughness at certain levels, thus achieving a transmission structure which is more efficient, repeatable and reliable. In some embodiments, it has been found that it is practical to reduce the surface roughness for the power plane by 30% to 50%. Such reductions in power plane surface roughness have achieved significant reductions in transmission losses. It will be appreciated that some embodiments will have a surface roughness of less than 1 micron (often measured as $R_z$, or $R_{rms}$). Those skilled in the art will recognize that the actual measured surface roughness and the calculated reductions can vary depending on a considerable number of characteristics.

Current techniques for reducing PCB loss involve employing expensive low-loss dielectric materials, along with smooth copper foils to achieve adequate design margins necessary for reliable high-speed design. While it may be necessary to use exotic materials to achieve the necessary system design margin, employing a reduced roughness copper power plane will afford greater latitude in the design of the overall board stackup. Using reduced roughness foil, power planes can now be placed in closer proximity to the adjacent signal layers resulting in a thinner board with less overall loss on these affected layers. In addition, this technique should afford greater overall electrical margin, allowing longer routing and/or less expensive materials to be employed, before hitting an absolute insertion loss margin specification.

The design concept of the preferred embodiments employ a technique which is applied to an unexpected component. Copper foil roughness reduction for signal loss improvement, is applied to an overlooked area of the PCB design (power and ground planes) to achieve a similar purpose. This is a strategic concept that allows manufacturers to leverage existing board technology and processing to achieve lower loss on stripline layers, through a novel modification of adjacent power or ground planes (for stripline transmission). Using this technique on boards today, during both the design and simulation stages, could allow for tighter stack-ups and thus thinner boards, while yielding the same loss characteristics. The cost for such a change would involve RTF rough copper foil vs. HVLP smooth copper (or other smooth process such as rolled copper)—the cost differential should be a fairly small percentage of the overall board cost, for an existing high-speed board. This approach to loss reduction, as a concept, is a bit arcane and nonintuitive, and as such it has not been implemented yet. Typically, board design has only focused on signal-based metal roughness losses, not magnetically-coupled losses onto rough copper material in adjacent power and ground structures.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

The invention claimed is:

1. A method of forming a signal transmission structure within a printed circuit board, the signal transmission structure having reduced signal loss characteristics, the method comprising:

determining respective surface roughness of a first surface and a second surface in the printed circuit board, which includes a reference plane coupled to a ground connection, a power plane coupled to a power source, and a strip-line transmission structure configured to support differential signal transmission, wherein the strip-line transmission structure is situated between the reference plane and the power plane, wherein the strip-line transmission structure is electrically isolated from the power plane and the reference plane by a dielectric material of a thickness;

wherein the power plane includes the first surface facing the strip-line transmission structure, wherein the surface roughness of the first surface is determined to be less than 1 micron, and wherein the reference plane includes the second surface facing the strip-line transmission structure, wherein the surface roughness of the second surface is determined to further reduce an electromagnetic effect upon the strip-line transmission structure; and determining, based on the respective surface roughness of the first and second surfaces, the thickness of the dielectric material such that the signal transmission losses in the strip-line transmission structure are within a range.

2. The method of claim 1, wherein the thickness is less than 5 mils.

3. The method of claim 1, further comprising determining a oxide chemical foil attach process for achieving the respective surface roughness of the first surface and the second surface.

4. The method of claim 1, further comprising determining a manufacturing process for achieving the respective surface roughness of the first surface and the second surface without a need for polishing.

5. The method of claim 1, wherein the surface roughness of the second surface is less than 1 micron.

6. The method of claim 1, wherein the differential strip-line signal transmission structure is embedded in the dielectric material.

7. The method of claim 1, wherein the surface roughness of the first and second surfaces is reduced by at least 30% with respect to a surface roughness of a second printed circuit board structure.

8. The method of claim 1, wherein the surface roughness of the first surface is configured to accommodate efficient bonding with the dielectric material.

9. The method of claim 1, wherein the surface roughness of the second surface is configured to accommodate efficient bonding with the dielectric material.

* * * * *